United States Patent Office 3,201,237

Patented Aug. 17, 1965

3,201,237

PHOTOGRAPHIC POLYMERIC IMAGES AND PROCESS FOR PRODUCING SAME

Edward Cerwonka, Binghamton, N.Y., assignor to General Aniline & Film Corporation, New York, N.Y., a corporation of Delaware No Drawing. Filed Dec. 9, 1960, Ser. No. 74,787
19 Claims. (Cl. 96—35)

This invention relates to photographic polymeric images and, in particular, to such images produced by the photopolymerization of an ethylenically unsaturated monomer contained in a photographic carrier by the combined action of a light-sensitive ferric salt and a compound capable of supplying active halogen.

It is known that certain unsaturated organic compounds undergo polymerization when exposed to high intensity radiation, such as sunlight or mercury vapor lamps, the process being generally designated as photopolymerization. It is likewise known that photopolymerization is extremely useful in the field of photography in which modulated radiation is cause to effect photopolymerization only where exposure takes place with the result that a polymeric photographic image or resist is formed, the density of which is proportional to the amount of exposure. The general procedure comprises applying to a suitable photographic support or base a photopolymerizable compound and the resulting layer exposed to a high energy light source, through a pattern. In the exposed areas, the polymerizable compound or material is polymerized to a more or less hard and insoluble mass whereas the unexposed areas which contain the original monomer can be easily removed usually by a simple washing operation. There is thus left in the irradiated areas a resist or image composed of an insoluble polymer or copolymer. Although such systems are theoretically workable, these are difficult to achieve in practice. A primary objection is the inordinately long exposure times required to sufficiently toughen or polymerize the polymerizable material in the exposed areas in order to establish the differentiation in hardness between the exposed areas on the one hand and the unexposed areas on the other, so the latter may be easily removed or washed away without affecting or otherwise damaging the polymer in the exposed areas. Moreover, the low speed of the system necessitates extremely high energy radiation sources, such as high intensity carbon arc or bright sunlight and this constitutes a decided disadvantage.

There have been many attempts to speed up the sensitivity of photopolymerizable systems and a wide variety of activators and initiators have been investigated for this purpose. For instance, Minsk et al., U.S.P. 2,610,-120, describes the use of light sensitive polymeric cinnamic acid esters such as polyvinyl cinnamate sensitized with various nitro compounds. One of the examples of this patent, a coating incorporating a light sensitive polyvinyl cinnamate, requires an exposure under a line or halftone image of one minute placed at a distance of 4′ from a 35 amp. white flame carbon arc.

Gerhardt, in U.S.P. 2,673,151, discloses a light sensitive copolymerizable mixture of (1) polyesters of $\alpha,\beta$-ethylenic, $\alpha,\beta$-dicarboxcylic acid and (2) ethylenically unsaturated compounds copolymerized therewith, such a composition being sensitized by the addition of sulfur compounds. In this reference, it is suggested that the composition be exposed by contact or by projection to the desired image, preferably under prolonged exposure until the action of the light has resulted in partial polymerization, i.e., when a gel stage is reached. If desired, the light source may then be removed and the mixture heated in order to effect a final curing. The specified radiation source is of the high intensity type, as exemplified by sunlight or a carbon arc, i.e., a source rich in ultraviolet radiation.

A more recent patent, U.S.P. 2,831,768, describes light sensitive polyvinyl arylphenones having increased photographic speed. According to the first example of this document, which, incidentally, is the only example therein containing photographic data, a coating using a light sensitive arylphonone requires an exposure of 2 min. at a distance of 10 inches from a sunlamp in order to bring imagewise polymerization.

It should also be noted that the high intensity radiant energy sources employed in the photopolymerization system as above described are also rich in infrared and heat rays. Consequently, a certain portion of the monomer or monomers may be polymerized by the action of heat which, since it is not modulated by the pattern, may interfere with the production of a clean relief or polymeric image. Thus, if a black and white silver halide negative pattern is used, there should be no polymerized areas under the dark portions of the pattern. However, the dark portions may absorb some radiant heat with sufficient local rise in temperature to effect heat polymerization of the monomer or polymerizable compound in these heated areas which are impervious to the visible or UV radiations. As a result, systems requiring a radiation source rich in heat rays are objectionable in that it is difficult to produce a clean cut sharp polymeric image.

It is believed to be manifest that a need exists in the photographic and kindred arts for a photopolymer system having increased speed or response to the exposing radiation in order to do away with high intensity exposing radiation sources. I have now discovered that monomeric ethylenically unsaturated organic compounds which are normally liquid or solid, i.e., liquid or solid at room temperature, may be directly polymerized in essentially short periods of time to high molecular weight solids by subjecting the monomer or mixtures thereof to an irradiated light sensitive ferric compound in the presence of a second compound capable of supplying active halogen. By using imagewise quantities of an irradiated ferric compound, I produce the corresponding photopolymeric image.

Preferred types of radiation-sensitive catalysts for practicing the invention are light sensitive ferric salts of the type commonly utilized in the Blueprint Process. Examples of light sensitive ferric salts which I have found satisfactory are ferric acetate, ferric and ammonium acetate, ferric ammonium citrate (brown), ferric ammonium citrate (green), ferric ammonium oxalate, ferric ammonium sulfate, ferric ammonium tartrate, ferric halides such as ferric bromide or ferric chloride, ferric citrate, ferric formate, ferric glycerol phosphate, ferric hydroxide, ferric nitrate, ferric phosphate, ferric potassium citrate, ferric potassium tartrate, ferric pyrophosphate, ferric sodium oxalate, ferric subsulfate, ferric sulfate, ferric succinate and the like.

By a compound capable of supplying active halogen is meant those halogenated compounds which provide "positive" halogen including the alkali metal hypo halites and N-halo organic compounds. Examples of compounds which can be utilized for this purpose are the alkali metal hypohalites such as sodium hypochlorite, sodium hypobromite, potassium hypochlorite, lithium hypochlorite and the like; also suitable are the N-halo organic compounds as represented by N-bromosuccinimide, Chloramine T (the sodium salt of N-chloro-p-toluenesulfonamide), N,N-dichlorodimethylhydantoin, N-chlorosuccinimide, monochlorourea, and the like. The description and preparation of positive halogen compounds are well known in the art and any of the numerous organic chemistry texts can be consulted for procuring detailed information on these compounds.

Any normally liquid to solid photopolymerizable ethylenically unsaturated monomer can be utilized as a source of the polymerizable material. By ethylenically unsaturated is meant those unsaturated organic compounds containing at least one nonaromatic double bond between adjacent carbon atoms. Compounds particularly advantageous are the photopolymerizable vinyl or vinylidene compounds containing a $CH_2=C<$ group activated by direct attachment to a negative group such as halogen, $>C=O$, $-C\equiv N$, $-C\equiv C$, $-O-$, or aryl. Examples of such photopolymerizable unsaturated organic compounds include acrylamide, acrylonitrile, N-ethanol acrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinyl butyl ether, vinylisopropyl ether, vinylisobutyl ether, vinylbutyrate, butadiene or mixtures of ethylacrylate with vinyl acetate, acrylonitrile with styrene, butadiene with acrylonitrile and the like. The above ethylenically unsaturated organic compounds, or monomers as they are sometimes called, may be used either alone or in admixture in order to vary the physical properties such as molecular weight, hardness, etc. of the final polymer. Thus, it is a recognized practice, in order to produce a vinyl polymer of the desired physical properties, to polymerize in the presence of a small amount of an unsaturated compound containing at least two terminal vinyl groups each linked to a carbon atom in a straight chain or in a ring. The function of such compounds is to cross-link the polyvinyl chains. This technique, as used in polymerization, is further described by Kropa and Bradley in vol. 31, No. 12, of "Industrial and Engineering Chemistry," 1939. Among such cross-linking agents for the purpose described herein may be mentioned N,N'-methylene-bis-acrylamide, triallyl cyanurate, divinyl benzene, divinyl ketones and diglycol diacrylate. Generally speaking, increasing the quantity of cross-linking agents increases the hardness of the polymer obtained in the range wherein the ratio of monomer to cross-linking agent varies from 10:1 to 50:1.

The quantity of ferric salts used to initiate polymerization of the monomer or unsaturated organic compound is not critical and may be varied over wide limits. In general, I have found that satisfactory results ensue if the proportion of ferric ion to monomer varies from 1:10,000 to 1:6.

The photopolymerization can be carried out under a wide variety of conditions employing numerous modifications. My system of photopolymerization is particularly valuable in the field of photography where its high speed and response to relatively low intensity radiation sources make it ideal for imagewise polymerization. One valuable application of my process, for example, is the production of relief printing plates for use in the graphic arts. Such plates can be fabricated by coating a mixture of monomer or monomers in a suitable solvent plus a small quantity of ferric salt on a suitable base or support. The resulting coating is exposed to a radiation source such as an incandescent bulb having a tungsten filament after which it is treated with a positive halogen compound. The exposed areas undergo rapid polymerization in the presence of a positive halogen compound and irradiated ferric salts whereas the unexposed areas are left unaffected so that the unreacted or unpolymerized monomers may be washed off or otherwise removed. A resist is thus formed of the photopolymer which can be used as a negative working relief plate. By employing a hydrophilic surface as the support for the coating such as a partially saponified cellulose acetate, a plate is produced heaving greasy, ink-receptive and water-receptive areas. Such a plate can then be used as a negative working offset plate for the production of printed copies.

In the field of photography, my invention can be used, for example, for the production of black and white prints. Thus, a light sensitive plate is prepared having coated thereon a layer comprising an unsaturated organic compound, a light sensitive ferric compound, a colloidal carrier material such as gelatin, a compound capable of supplying positive halogen, such as sodium hypochlorite, N,N-dichlorodimethylhydantoin or N-chloro-p-toluenesulfonamido and a finely divided black pigment. This plate is then exposed beneath a silver negative which causes polymerization in the exposed areas of the coating. After washing with water to remove unpolymerized monomer in the unexposed regions, there is obtained a reversed polymeric photographic image.

In some instances, it may be desirable to employ a normally solid hydrophilic colloid as the carrier for the light sensitive ferric compound. Suitable colloid carriers for this purpose include polyvinyl alcohol, casein, glue, saponified cellulose acetate, carboxymethyl cellulose, starch and the like.

Another photographic application of my invention is in color reproduction. For example, a light sensitive plate is prepared as described above, i.e., containing a monomer and ferric compound, and exposed to one of the primary color aspects of a subject using a color separation negative. After treatment with a positive halogen compound to effect polymerization in the exposed areas, the so-obtained polymerized image is then substractively dyed. By exposing other light sensitive plates to the remaining primary color aspects of the subject, processing as described above to effect polymerization in the exposed areas followed by dyeing with the appropriate subtractive dye, superimposition of the resulting subtractively colored images will then reproduce the original subject.

Other uses to which the above photopolymers may be put include such photographic and lithographic applications as for example in the production of bimetallic printing plates, etched copper halftone images, printing plates having cellulose ester supports, grained zinc or aluminum lithographic plates, zincated lithographic printing plates, ungrained copper printing plates for preproofing copper, chromium bimetallic plates, etc.

Numerous materials are suitable as supports or bases for the radiation sensitive plates prepared in accordance with the process described herein, such as cellulose ester supports including the hydrophobic variety or the type having a surface made hydrophilic by a partial saponification, metals such as aluminum or zinc, terephthalic acid ester polymers, paper, glass or the like.

A further advantage of my photosensitive coatings and materials arises as a result of their stability so that they are not adversely affected on storage under conditions of excessive humidity and temperature. In this respect, the new materials are superior to the old bichromated glue or albumin layers of the prior art which must be prepared and sensitized just prior to usage because of their poor keeping qualities.

As previously pointed out, it is a distinct advantage of the invention that the exciting or exposing radiation can be from a low intensity source such as an ordinary household incandescent lamp. Thus, high energy radiation sources such as carbon flame arcs or mercury arcs, commonly employed to effect photopolymerization in the prior art processes, are dispensed with in my process. Furthermore, my photosensitive materials, in addition to eliminating the need for high intensity radiation, also possess high speed requiring only a few seconds' exposure to effect imagewise polymerization and are thus equal to some of the lower speed silver halide photographic products of the office duplicating type. It is suggested that the mechanism by which the process operates is of the free radical type. When an iron compound in the form of ferric salt is exposed to light, it is transformed or reduced to the ferrous state which, in the presence of a positive halogen or similar material, results in the formation of free radicals which, in turn, causes polymerization of unsaturated organic compounds or monomers. Furthermore, only a few photoproduced ferrous ions are required to initiate rapid and vigorous polymerization in the presence of positive halogen compounds since very low exposure times to relatively feeble radiation is sufficient. In other words, the photopolymerization of the instant invention makes use of an amplification factor, that is to say, slight photochemical changes can be used to trigger or modulate a much more vigorous secondary reaction, in this case, the polymerization of unsaturated organic compounds.

It is immaterial as to what order the iron compounds, monomer and source of free radicals are brought into contact. All three components can be mixed and exposed. For imagewise polymerization, however, it is desirable to combine the monomer and sensitive ferric compound followed by exposure and subsequent treatment with a positive halogen compound. The latter procedure has the advantage of yielding an extremely stable composition from which coatings can be manufactured having very long shelf life both before and after exposure. Since, in this ramification, the halogen compound does not contact the iron sensitized monomer until after exposure, a highly reactive type of positive halogen compound can be employed as the developer to bring about rapid polymerization. In other words, a latent image of irradiated or exposed ferric salts is used to trigger or effect rapid imagewise polymerization of an unsaturated organic compound.

Those skilled in the art, using the description and benefit of the present disclosure, can ascertain those combinations of monomers, iron compound and free radical source which will yield best results.

*Example I*

A composition was prepared from the following components:

| | Parts |
|---|---|
| Acrylamide | 180 |
| N,N-methylene-bis-acrylamide | 7 |
| Water | 120 |

This is designated as solution "*a*." Solution "*b*" was produced as follows:

5.0 grams of gelatin were dissolved in 44.0 ml. of water, to which had previously been added 1.8 grams of brown ferric ammonium citrate, 15 drops of glycerin and 1 ml. of a 1 N solution of sodium hypochlorite. Solution "*a*" and solution "*b*" were mixed and the resulting composition coated on photographic paper base. After drying, the coating was exposed through a negative to a 370 watt photoreflector incandescent lamp for 1 minute after which the coating was washed with warm water. In the exposed areas the unpolymerized coating was washed away, whereas, an insoluble resist remained in the exposed areas.

*Example II*

The same procedure was followed as given in Example I except that the composition was coated on filmbase. The results approximately those obtained in the first example.

*Example III*

5.0 grams of gelatin were dissolved in 45 ml. of water containing 1.8 grams of brown ferric ammonium citrate, 15 drops of glycerin, 0.10 gram of N,N-dichlorodimethylhydantoin and 0.10 gram of sodium bicarbonate. The resulting mixture was combined with solution "*a*" as described in the first example and the so-obtained mixture coated on photographic paper base. After drying, the coating was exposed through a negative to a 375 watt photo-reflector incandescent lamp for 1 minute. The coating was washed with warm water to remove the unpolymerized parts of the coating corresponding to the unexposed areas, leaving an insoluble resist in the exposed areas.

*Example IV*

The procedure of the previous example was again carried out with the exception that the photographic paper base was replaced by a film base. The procedure and result were approximately the same as those obtained in the previous examples.

*Example V*

5.0 grams of gelatin were dissolved in 45 ml. of water to which had been previously added 1.8 grams of brown ferric ammonium citrate, 15 drops of glycerin, 0.50 gram of "Chloramine T" (the sodium salt of N-chloro-p-toluenesulfonamide and 0.15 gram of sodium bicarbonate. This solution was combined with solution "*a*" as prepared in Example I and the resulting mixture coated on a photographic paper base. After drying, the layer was exposed through a negative to the light emanating from a 375 watt photoreflector incandescent lamp for 1 minute. The exposed coating was washed with warm water to remove the unpolymerized portions of the coating corresponding to those areas receiving no exposure, in order to isolate the insoluble polymeric photographic image remaining in the exposed areas.

*Example VI*

The procedure of the previous example was repeated, but in this case, the support was filmbase. The preparation and results obtained closely paralleled those of the previous example.

In the following examples the reactive halogen compound is included in the washing solutions, rather than in the photographic light sensitive coatings.

*Example VII*

5.0 grams of gelatin were dissolved in 45 ml. of water containing 1.8 grams of brown ferric ammonium citrate and 15 drops of glycerin. This solution was combined with solution "*a*" prepared in the first example, and the resulting mixture coated on a photographic paper base. After drying, the coating was exposed for 1 minute to a negative to the light emanating from a 375 watt photoreflector incandescent lamp and the exposed coating bathed in a solution comprising 1 part of 1 N sodium hypochlorite in 1 part of 1 N ammonium hydroxide per liter of water. In the unexposed areas of the coating, the processing solution removed the unpolymerized layer, whereas, a polymerized photographic image was formed in the areas of the coating corresponding to high exposure. In general, the results corresponded to those obtained in the earlier examples, wherein the reactive halogen compound was incorporated in the coating per se.

*Example VIII*

The following example describes a method for obtaining a colored polymeric photographic image.

5.0 grams of gelatin were dissolved in 45 ml. of water, 1.8 grams of brown ferric ammonium citrate and 15 drops of glycerin. This mixture was then combined with 6 ml. of solution "*a*" of the first example and a nigrosine dye dispersed intimately in the resulting mixture. The so-obtained composition was then coated on a photographic paper base and after drying the sensitized layer was exposed through a negative to a light emanating from a 375 watt photoreflector incandescent lamp. The exposed coating was then bathed in a solution containing 1 gram of a 5% sodium bicarbonate solution and 1 gram of a 5% dimethyl-N,N-dichlorohydantoin solution per liter of water. A photographic polymeric image was obtained in the exposed areas. In this case, because of the dispersed dye, the polymeric photographic image was of high optical opacity, but otherwise resembled the polymeric photographic images produced in the preceding examples.

*Example IX*

5 grams of gelatin were dissolved in 45 ml. of water containing 1.8 grams of brown ferric ammonium citrate and 15 drops of glycerin. This solution was blended with 6.0 ml. of the solution from Example I and the resulting mixture coated on a photographic paper base and allowed to dry. The coating was then exposed through a negative to a 375 watt reflector incandescent lamp after which the coating was bathed in a solution containing 10% by weight of "Chloramine T." After thorough bathing in the "Chloramine T" solution, unpolymerized material was removed corresponding to the areas receiving no exposure whereas a polymeric photographic image was formed in the areas corresponding to high exposure. In general, the properties and quality of the photographic resist image resembled those produced by the procedures of the previous examples.

I claim:

1. A process of producing a polymeric photographic image which comprises exposing to a pattern of actinic radiation in the ultraviolet to visible region of the spectrum a photographic element carrying on a suitable support a light sensitive layer comprising a monomer containing a terminal $CH_2{=}C{=}$ group and a light sensitive ferric salt of an organic acid dispersed in a photographic colloidal hydrophilic carrier material, to form by said exposing imagewise quantities of exposure activated iron salt; in said layer contacting the exposed material with a solution of compound capable of supplying positive halogen, said compound being selected from the group consisting of alkali metal hypohalites, N-bromosuccinimide, the sodium salt of N-chloro-p-toluenesulfonamide, N,N-dichlorodimethylhydantoin, N - chlorosuccinimide and monochlorourea, whereby polymerization occurs in proportion to the amount of activated iron salt; removing by washing any residual unpolymerized monomer thereby leaving a polymerizable photographic image the density of which corresponds to the intensity of the exposing radiation pattern.

2. The process as defined in claim 1 wherein the colloidal carrier material is gelatin.

3. The process as defined in claim 1 wherein the monomer is acrylamide.

4. The process as defined in claim 1 wherein is added to said monomer a cross-linking agent having at least two vinyl groups.

5. The process as defined in claim 4 wherein the cross-linking agent is selected from the class consisting of N,N'-methylene-bis-acrylamide, triallyl cyanurate, divinyl benzene, divinyl ketones, and diglycol diacrylate.

6. The process as defined in claim 1 wherein said pattern of actinic radiation is a pattern of visible light.

7. The process as defined in claim 1 wherein said compound capable of supplying the positive halogen is sodium hypochlorite.

8. The process as defined in claim 1 wherein the compound capable of supplying positive halogen is the sodium salt of N-chloro-p-toluenesulfonamide.

9. The process as defined in claim 1 wherein the compound capable of supplying active halogen is N,N-dichlorodimethylhydantoin.

10. A photographic element carrying on a support a layer comprising a photographic hydrophilic colloid carrier material containing a monomer having a terminal $CH_2{=}C{=}$ grouping, a light sensitive ferric salt of an organic acid and a compound capable of supplying positive halogen, said compound being selected from the group consisting of alkali metal hypohalites, N-bromosuccinimide, the sodium salt of N-chloro-p-toluenesulfonamide, N-bromosuccinimide, N-N-dichlorodimethylhydantoin, N-chlorosuccinimide and monochlorourea, said layer being capable of producing polymeric images when exposed to a pattern of actinic radiation and developed in the presence of a solvent for said monomer.

11. The product as defined in claim 10 wherein said ferric salt is ferric ammonium oxalate, 12. The product as defined in claim 10 wherein said ferric salt is ferric ammonium citrate.

13. The product as defined in claim 10 wherein the photographic colloid carrier is gelatin.

14. The product as defined in claim 10 wherein the monomer is acrylamide.

15. The product as defined in claim 10 wherein the ethylenically unsaturated monomer contains a cross-linking agent having at least two terminal vinyl groups.

16. The product as defined in claim 10 wherein the cross-linking agent is selected from the class consisting of N,N'-methylene-bis-acrylamide, triallyl cyanurate, divinyl benzene, divinyl ketones and diglycol diacrylate.

17. The product as defined in claim 10 wherein the alkali metal hypohalite is sodium hypochlorite.

18. The product as defined in claim 10 wherein the compound capable of supplying positive halogen is the sodium salt of N-chloro-p-toluenesulfonamide.

19. The product as defined in claim 10 wherein the compound capable of supplying positive halogen is N,N-dichlorodimethylhydantoin.

References Cited by the Examiner

UNITED STATES PATENTS

| | | | |
|---|---|---|---|
| 2,344,785 | 3/44 | Owens | 96—115 |
| 2,388,372 | 11/45 | Stewart | 260—84.5 |
| 2,388,373 | 11/45 | Stewart | 260—84.5 |
| 2,875,047 | 2/59 | Oster | 96—35 |
| 2,927,021 | 3/60 | Sorkin | 96—35 |
| 3,029,145 | 4/62 | Dumers et al. | 96—115 X |
| 3,101,270 | 8/63 | Evans et al. | 96—115 |

FOREIGN PATENTS

| | | |
|---|---|---|
| 585,969 | 3/47 | Great Britain. |

OTHER REFERENCES

Remy: Treatise on Inorganic Chemistry, vol. 1, 1956, Elsevier Pub. Co., New York, pp. 803, 180 and 811.

NORMAN G. TORCHIN, *Primary Examiner.*

HAROLD N. BURSTEIN, *Examiner.*